United States Patent [19]

Sempel et al.

[11] Patent Number: 5,408,196
[45] Date of Patent: Apr. 18, 1995

[54] TUNABLE DEVICE

[75] Inventors: Adrianus Sempel; Johannes Van Nieuwenburg, both of Eindhoven, Netherlands

[73] Assignee: U.S. Philips Corporation, New York, N.Y.

[21] Appl. No.: 213,775

[22] Filed: Mar. 16, 1994

[30] Foreign Application Priority Data

Mar. 29, 1993 [EP] European Pat. Off. ........... 93200894

[51] Int. Cl.⁶ .......................... H03D 3/00; H03L 1/00; H03L 7/00; H03L 7/20
[52] U.S. Cl. .................... 329/325; 329/318; 331/16; 331/19; 331/23; 331/44; 435/260; 435/264; 435/340
[58] Field of Search ................. 329/325, 318; 331/16, 331/18, 19, 23, 44, 78; 455/192.2, 214, 260, 264, 266, 286, 293, 339, 340

[56] References Cited

U.S. PATENT DOCUMENTS

| | | | |
|---|---|---|---|
| 3,059,187 | 10/1962 | Jaffe | 331/19 X |
| 4,001,714 | 1/1977 | Reed | 331/19 X |
| 4,847,569 | 7/1989 | Dudziak et al. | 331/25 |
| 4,855,944 | 8/1989 | Hart | 364/602 |
| 5,179,725 | 1/1993 | Camp, Jr. et al. | 331/19 X |
| 5,343,168 | 8/1994 | Guthrie | 331/16 |

*Primary Examiner*—David Mis
*Attorney, Agent, or Firm*—Edward W. Goodman

[57] ABSTRACT

A signal receiving device is kept tuned by a tuning signal, which supplied to a tuning input of a tunable circuit in the signal receiving device. The tuning signal is supplied from a memory. The signal receiving device has an operating state and a calibrating state. The calibrating state serves to determine the tuning signal and to store it in the memory. In the calibrating state, a broadband signal source supplies a broadband signal to a band-pass filter. The band-pass filter is tuned to and passes a reference signal to the tunable circuit which provides the signal receiving device with selectivity in the operating state. The response of the tunable circuit to the reference signal is monitored and a tuning signal is selected for which it is measured that the tunable circuit is tuned to the reference signal which is passed by the band-pass filter.

10 Claims, 2 Drawing Sheets

TUNABLE DEVICE

BACKGROUND OF THE INVENTION

1. Field of the Invention

The invention relates to a signal receiving device comprising control means for switching the device between an operating state and a calibrating state, the device comprising a tunable circuit arranged between a main signal input and a main signal output, for passing operating signals during the operating state, the device also comprising a calibrating signal source, for supplying a calibrating signal to the main signal input, the main signal output being coupled to tuning signal selecting and storing means, arranged for selecting a tuning signal which, when supplied to a tuning input of the tunable circuit, tunes the tunable circuit to a spectral component of the calibrating signal during the calibrating state and storing said tuning signal in memory means, which are arranged for supplying said tuning signal subsequently to the tuning input during the operating state.

The invention also relates to a method for calibrating a tunable circuit for operation under control of a stored tuning signal, the method comprising supplying a reference signal to the signal input, subsequently measuring the tuning signal which tunes the tunable circuit to said reference signal, storing that timing signal.

Tunable circuits are often used in devices such as radio receivers, for example at the intermediate frequency demodulation stage. For robust and sensitive signal reception, the tunable circuit must be tuned to, or at least be tuned close to, the frequency of the signal to be received. Proper tuning can however not be guaranteed merely by the manufacture of such circuits. This is because of process fluctuations during manufacturing, and also for example due to aging and temperature effects during use.

2. Description of the Related Art

To eliminate such effects, the tuning of the tunable circuit must be calibrated. An example of a tunable circuit provided with tuning means according to the preamble is an automatic calibration system for a voltage controlled oscillator known from U.S. Pat. No. 4,847,569. This publication discloses a voltage controlled oscillator which is automatically calibrated in the calibrating state. The generator comprises a phase locked loop (PLL). In the calibrating state, the PLL is made to lock onto a reference signal which has an accurately known frequency (obtained from a crystal oscillator). The control signal for the oscillator in the locked state of the loop is then stored in the storing means. In the operating state, this stored tuning signal is supplied to the oscillator and serves to pretune the oscillator.

The known device has the disadvantage that it requires a reference signal with accurately known frequency for calibration. One way of supplying such a reference signal is to use a crystal oscillator as pan of the device, but this adds to the complexity of the device and is expensive. Another way is to use an external signal source, but this is impractical, especially when calibration is required repeatedly.

SUMMARY OF THE INVENTION

Among others, it is an object of the invention to provide for a device which is capable of calibration without requiring accurate additional circuitry or an external generator for the calibration. Another object of the invention is to provide a method for calibrating a signal receiving device.

The device according to the invention is characterized, in that the calibrating signal source is a broadband signal source which is switched to the main signal input in the calibrating state, the calibrating signal containing a plurality of spectral components, to at least one of which the tunable circuit is tunable, and in that the device comprises a band-pass filter in series with the tunable circuit between the signal input and output, said at least one component being passed by the band-pass filter. In this way the band-pass filter, which is normally used in the operating state to provide frequency selectivity for signals in the device, is also used for providing accuracy of tuning in the calibrating state. Thus, the accuracy of the signal source is no longer critical for calibration. Its spectrum (that is, the collection of frequencies at which the signal source has a substantially nonzero the spectral density) can be made as wide as is needed to ensure that deviations of its parameters due to manufacture, aging or temperature effects cannnot cause it to lie outside the frequency range in which the tunable circuit is tunable and the band-pass filter passes signals.

An embodiment of the device according to the invention, is characterized, in that the calibrating signal source is a broadband noise source. A broadband noise source is easily implemented, using either a synthetic noise source like a linear feedback shift register, or a natural noise source like a reverse biased p-n junction in Zener breakthrough.

An embodiment of the device according to the invention is characterized, in that the band-pass filter is provided between the main signal input and the tunable circuit, the band-pass filter having a passband which has a first overlap with a tuning range of the tunable circuit, a spectral range covered by the spectral components having at least a second overlap with the first overlap.

Preferably, the broadband noise source has a substantially frequency independent spectral density at least in the passband. In this way the tuning signal will reflect the properties of the band-pass filter only, and will not be biased by the noise source.

In an embodiment of the device according to the invention, the tunable circuit includes a phase locked loop, the main signal input being coupled to a first input of a phase detector, which has an output for a lock signal coupled to a frequency control input of an oscillator which has an output coupled to a second input of the phase detector, the tuning input being coupled to biasing means for biasing the lock signal with the tuning signal, the tuning signal selecting and storing means being arranged for storing the lock signal as the tuning signal. In this way, the phase locked loop, which is used in the operating state, is also used in the calibrating state. No additional circuitry is needed for determining the tuning signal which biasses the tunable circuit (the oscillator) to the band-pass filter. Because the oscillation frequency is biassed to match the band-pass filter, the phase locked loop will be better able to lock on to weak input signals in the passband.

Biassing may for example, be effected by adding the tuning signal to the phase detection signal, the tuning means being arranged for generating the lock signal in the calibrating state by adding a zero reference to the phase detection signal, the tuning means being arranged for storing the phase detection signal as the tuning signal in the calibrating state.

A further embodiment of the device according to the invention is characterized, in that the phase lock loop comprises loop capture range setting means, the control means being arranged to control the setting means to set the capture range to a first range in the operating state and to a second range, wider than the first range and comprising said second overlap, in the calibrating state. In the operating state, a narrow capture range ensures a selective phase lock which is robust against interference from signals outside the capture range. In the calibrating state, the wider capture range, in combination with the reference signal which is supplied internally with sufficient strength, ensures the possibility to calibrate the oscillator to the band-pass filter even if its oscillation frequency is initially far away from the passband.

The device may be switched into the calibrating state at a number of occasions. When the band-pass filter is itself tunable, it may be switched to calibration each time the tuning of the band-pass filter is changed. Even when the tuning of the band-pass filter is not changed, the device may be switched to the calibrating state, for example when the device is manufactured, or each time the device is switched on, or when it is temporarily unnecessary to keep the device in the operating state.

In an embodiment of the device according to the invention characterized, in that it comprises out of lock detection means, for detecting whether the phase locked loop is out of lock in the operating state, and for thereupon signalling the control means to switch the device into the calibrating state. In this way automatic calibration is provided for when the device becomes detuned during operation, for example due to temperature drift.

In an embodiment of the device according to the invention characterized, in that the tunable circuit is an FM receiver/demodulator, a phase detection output of the phase locked loop feeding a demodulated FM signal output. For example, in an FM receiver the demodulator is operated at 10.7 MHz. In television sets, the audio demodulator is an FM detector operated at some frequency dependent on the system (PAL, NTSC etc). In such detectors the band-pass filter is the intermediate frequency filter, usually a ceramic filter, which is manufactured to have an accurately positioned passband. According to the invention, this is the only component that needs to be made accurately.

An embodiment of the device according to the invention is characterized, in that the tunable circuit is a tunable band-pass filter, provided between the signal input and the band-pass filter. This provides for alignment of the tunable filter with the band-pass filter.

A further embodiment of the device according to the invention is characterized, in that the tunable band-pass filter is coupled to the band-pass filter via a retunable frequency converter, the control means being arranged for switching the device into the calibrating state upon retuning of the frequency converter, for calibrating the tunable circuit to the retuned frequency converter. An example of such a device is a superheterodyne receiver, in which the band-pass filter is the intermediate frequency filter and the frequency converter contains the local oscillator.

The method according to the invention is characterized, in that the reference signal is generated by band-pass filtering a broadband signal, the broadband signal having a spectrum which has a common overlap with both a tuning range of the tunable circuit and a passband of the band-pass filtering operation. Using this method, one does not require a reference source with an accurate frequency for tuning the device.

BRIEF DESCRIPTION OF THE DRAWINGS

The invention and its advantageous aspects will be described by means of Figures, in which.

DESCRIPTION OF THE PREFERRED EMBODIMENT

Figure 1:
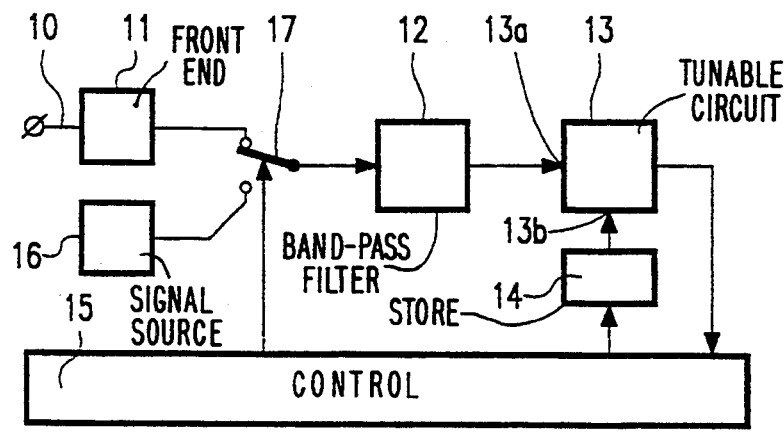
FIG. 1 shows an signal receiving device embodying the invention.

Frequency selective signal receiving devices are used for many purposes, including for example, radio or television reception. FIG. 1 shows a structure for a signal receiving device R. The signal receiving device R has a device input 10, coupled to a front end 11. The front end 11 has an output coupled to a band-pass filter 12 via a switch 17. The band-pass filter 12 is coupled to a signal input 13a of a tunable circuit 13. The device R also comprises storing means 14, in which a tuning signal is stored. The storing means 14 are coupled to a tuning input 13b of the tunable circuit 13.

In addition, the signal receiving device R comprises control means 15 and a signal source 16. The control means 15 are arranged for controlling the switch 17, to connect either the output of the front end 11, or the output of the signal source 16 to the band-pass filter 12. The tunable circuit has a measurement output coupled to the control means 15. The control means 15 are furthermore coupled to the storing means 14.

In use, the control means 15 provide for switching the signal receiving device R between an operating state, which corresponds to the position of the switch 17 shown in FIG. 1, and a calibrating state, in which the output of the signal source 16 is coupled to the band-pass filter 12.

In the operating state, the band-pass filter 12 serves to select an input signal of interest from the signals arriving at the device input 10 for processing in the tunable circuit 13. In a radio receiver, for example, the front end 11 may be a preamplifier, and the band-pass filter 12 is a tunable filter selecting the frequency of a channel to be received. In this case, the tunable circuit 13 comprises a local oscillator and a mixer for mixing the input signal at the signal input 13a with a local oscillation signal. The tuning signal tunes the frequency of the local oscillator to the channel to be received.

The tunable circuit 13 must be tuned to match the passband of the band-pass filter 12. The calibrating state serves for finding a tuning signal that tunes the tunable circuit 13 to match the band-pass filter 12. For this purpose, the signal source 16 provides an input signal to signal input 13a of the tunable circuit. The control means 15 monitor the response of the tunable circuit 13 to the signal supplied to the signal input 13a from the signal source 16. From the response it is determined which tuning signal tunes the tunable circuit 13, and this signal is stored in the storing means 14. The tuning signal may for example, be determined by measuring the response of the tunable circuit 13 to a number of different tuning signals and selecting the tuning signal with the best response.

To ensure that there is a sufficient spectral component of the reference signal in the passband, the signal source 16 is implemented as a broadband signal source which has a spectral overlap with the passband of the band-pass filter 12. The band-pass filter 12 will shape the spectrum of the signal supplied to the signal input 13a of the tunable circuit 13. This spectrum will therefore always lay within the passband of the band-pass filter 12. The precise position of the spectrum of the signal source 16 is no longer critical, and may be subject to factory tolerance, drift etc. without detriment to the calibration, as long as the spectrum retains an overlap with the passband of the band-pass filter 12.

Figure 2:
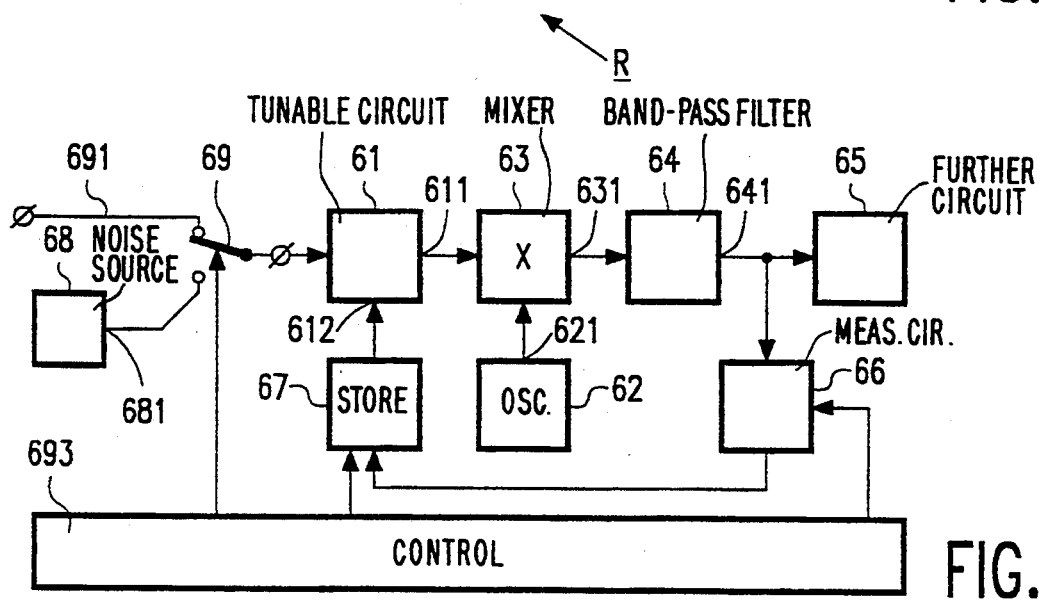
FIG. 2 shows another signal receiving device according to the invention.

FIG. 2 shows another signal receiving device according to the invention. This device contains a tunable circuit 61. The device also contains an oscillator circuit 62. Outputs 611, 621 of both the oscillator circuit 62 and the tunable circuit 61 are connected to a mixer 63. An output 631 of the mixer 63 is connected to a band-pass filter 64. The output 641 of the band-pass filter 64 is connected to a further circuit 65 and to a measuring circuit 66. The measuring circuit 66 is connected to an input of storing means 67. The storing means are connected to a tuning input 612 of the tunable circuit 61.

The device also contains a signal input 691 and a noise source 68 with a noise output 681. The device contains a switch 69 for selectively connecting the signal input 691 or the noise output 681 to an input of the tunable circuit 61. The device contains control means 693, coupled for controlling the switch 69, and for controlling the measuring means 66.

An example of a device as shown in FIG. 2 is a super heterodyne radio receiver. In this case, the oscillator 62 and mixer 63 serve to convert a predetermined signal frequency of a received signal to an intermediate frequency within the passband of the band-pass filter 64. In this case, the frequency of the oscillator 62 and the predetermined frequency differ from each other by the intermediate frequency. Usually, the frequency of the oscillator is above the predetermined frequency by this amount.

The tunable circuit 61 in the radio receiver is a tunable filter, which must have maximum transfer for the signal frequency, and must reject signals with the image frequency (that is the frequency with an intermediate frequency above the frequency of the oscillator 62). The tunable filter 61 must be tuned to match the predetermined frequency, that is, a frequency determined by the oscillator 62 frequency and the location of the passband of the band-pass filter 64.

In another example, the front end 11 comprises the local oscillator and mixer, the band-pass filter 12 being an intermediate frequency filter, which itself is not tunable. In this case, the tunable circuit 13 may for example, comprise a further local oscillator or a further filter with a tunable further passband. In case of a further local oscillator, the tuning signal for example adjusts the oscillation frequency to lie in the passband of the band-pass filter 12 or at a predetermined offset from this passband. In case of the further filter, the tuning signal controls the position of the further passband to match the frequencies passed by the band-pass filter 12.

The tunable circuit 61 must be also be tuned to match the passband of the band-pass filter 64. The calibrating state serves for finding a tuning signal that tunes the tunable circuit 61 to match the band-pass filter 64. The measuring means 66 monitor the response of the tunable circuit 61 to the signal supplied to the signal input from the signal source 68. From the response it is determined which tuning signal tunes the tunable circuit 61, and this signal is stored in the storing means 67. The signal source 68 is implemented as a broadband signal source which generates a signal that is processed by the tunable circuit 61 and the mixer 63. The signal produced by this processing is applied to the band-pass filter 64. In the calibrating state the tuning signal applied to the tuning input 612 of the tunable filter 61 is adjusted such that the signal resulting from the processing is tuned to the band-pass filter 64.

Figure 3:
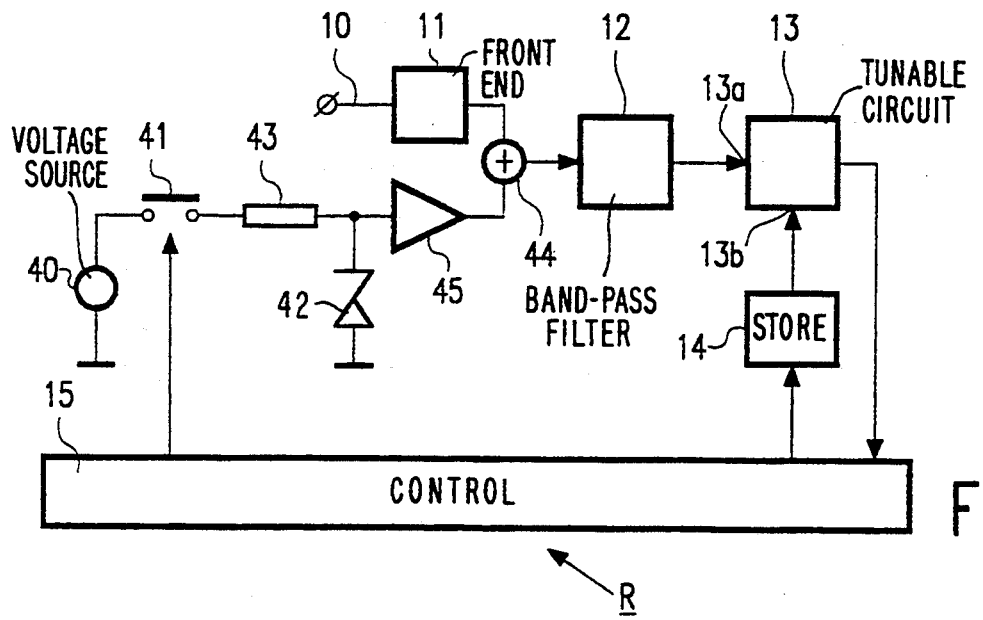
FIG. 3 shows an signal receiving device embodying the invention with a zener diode as noise source.

Preferably a broadband noise source is used as signal source 16 or 68. A convenient noise source is a p-n junction supplied with sufficient voltage to bring it into Zener breakdown. FIG. 3 shows a circuit for this purpose. FIG. 3 is identical to FIG. 1, except that it contains a voltage source 40, connected via a switch 41 and a resistor 43 to a junction diode 42. The junction diode 42 is coupled via an amplifier 45 and adding circuit 44 to the input of the band-pass filter 12. The front end 11 is also coupled to the band-pass filter 12 via the adding circuit 44.

In use, the switch 41 will be non-conductive during the operating state. In the calibrating state, the switch 41 will be conductive. This means that the voltage produced by the voltage source 40 is supplied to the diode 42. The voltage must be sufficient to cause Zener breakdown in the diode 42. In Zener breakdown, the diode 42 will produce a noise voltage which is fed to the band-pass filter 12 via the amplifier 45. For sensitive circuits, the noise generated at the diode 42 may be sufficiently strong for calibration. In this case the amplifier 45 may be omitted.

As shown in FIG. 3, the front end 11 remains coupled to the band-pass filter 12 via the adding circuit 44 even in the calibrating state. This will not affect calibration, provided that the strength of the noise signal fed to the adding circuit is greater than that of any signal arriving from the front end. Of course one may also use the switch 17 shown in FIG. 1 instead of the adding circuit 44 for connecting the Zener diode 42 to the band-pass filter 12.

Instead of a natural noise source, like the zener diode 42, the signal source 16 can be a synthetic noise source, such as a linear feedback shift register, described for example, in U.S. Pat. No. 4,855,944. Sources for other broadband signals may also be used; an example is a signal of periodic spikes, having a repetition frequency less than the width of the passband of the band-pass filter 12. The distance between the harmonics of such a signal is so small that at least one harmonic will always lie in the passband.

In principle, for calibration it suffices that there is an overlap between the passband of the band-pass filter 12, the tuning range of the tunable circuit 13 and the spectrum of the signal source 16, preferably the noise source (i.e. the range of frequencies in which the output of this source has non-zero power density). However, it is preferred that the spectral density is frequency independent in the passband. In this case, the passband alone will be decisive for tuning. Any bias in the tuning due to the spectral density is thus avoided. In practice the power density of most noise sources is frequency independent over a very wide range. Therefore an overlap is almost automatically assured in spite of factory tolerances or drift.

The calibrating state may be activated as often as necessary. When the band-pass filter 12 has a fixed passband, and the signal receiving device R is very stable, it may suffice to calibrate only once after manufacturing. It may also be sufficient to calibrate each time the signal receiving device R is switched on. Alternatively, if the signal receiving device R is for example a television, calibration might for example take place each time the channel is changed, because the user will not notice the short interruption of the operating state at this time.

Figure 4:
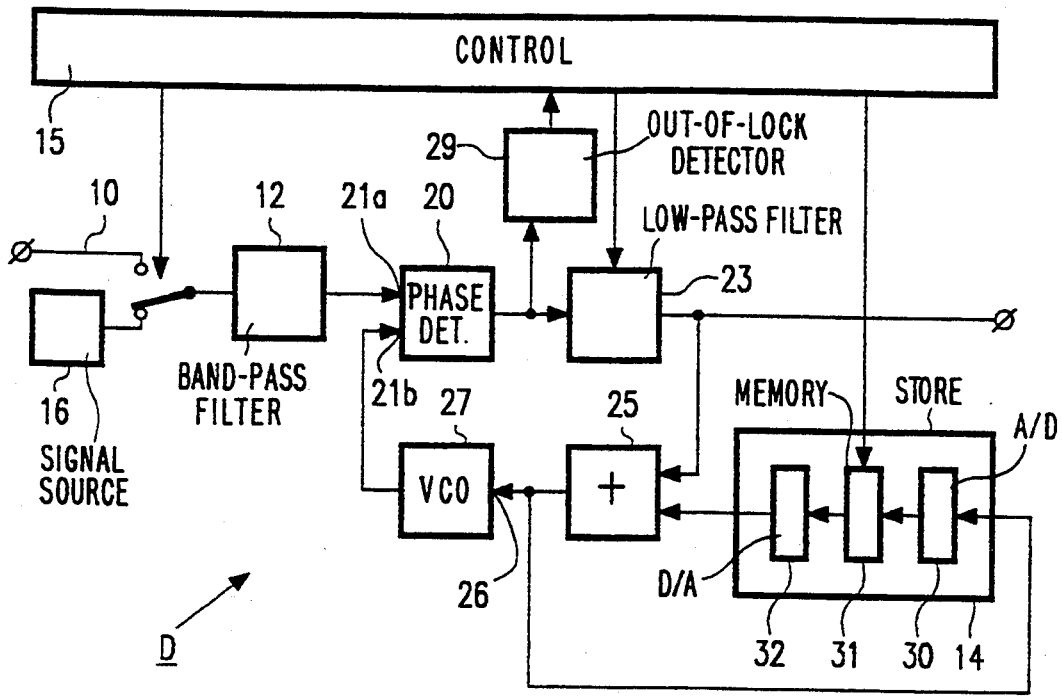
FIG. 4 shows a device embodying the invention in a phase locked loop.

FIG. 4 shows a device D embodying the invention in a phase locked loop for demodulating an FM signal. The device D shown in FIG. 4 comprises a device input 10 and a signal source 16 which are connected to a selection switch 17 which is also connected to an input of the band-pass filter 12. An output of the band-pass filter is coupled to a first input 21a of a phase detector 20. This phase detector 20 is part of a phase locked loop. The loop contains the phase detector 20, a low-pass filter 23, summing means 25 and a voltage controlled oscillator 27. The phase detection output 22 of the phase detector 20 is coupled to the low-pass filter 23. The low-pass filter will pass only the low frequency components of the phase detection signal; depending on the design of the loop, the low-pass filter may also comprise an amplifier for amplifying these low pass frequency components. The output of the low-pass filter 23 serves as device output and is also coupled to a first summing input of summing means 25. A sum output of the summing means 25 is coupled to the control voltage input 26 of a voltage controlled oscillator 27. The oscillation signal output of the voltage controlled oscillator 27 is coupled to a second input 21b of the phase detector 20.

The storing means 14 comprise, in series successively an analog-to-digital converter 30, a digital memory 31 and a digital-to-analog converter 32. The output of the summing means 25 is coupled to the analog input of the analog-to-digital converter 30. The analog output of the digital-to-analog 32 converter is coupled to a second summand input of the summing means 25. The control means 15 have a write control connection to the memory 31. The phase detection output 22 of the phase detector 20 is coupled to an out-of-lock detector 29 coupled to the control means 15. The position of the switch 17 corresponds to the calibrating state.

The device may be used for example, for demodulating the frequency modulated (FM) sound channel of a television receiver. A television signal contains different components such as intensity and color components and one or more sound channels each in a different pan of the spectrum. In the operating state of the receiver D, a combination of these components is supplied to the input 10. In the operating state the switch 17 connects the device input 10 to the band-pass filter. The band-pass filter 12 lets through only the signal of one sound channel and supplies it to the phase locked loop at the first input 21a of the phase detector 20. For filtering of such an FM signal with a predetermined frequency range, one may use a fixed ceramic band-pass filter 12.

The phase detector is part of the phase locked loop, which serves to demodulate the FM sound signal. The operation of a phase locked loop for FM demodulation is well known and has been described for example in the book "Phaselock Techniques" by F. M. Gardner, second edition published by John Wiley and Sons (New York 1979) in section 9.2, in particular on pages 175 and 176.

In response to the signal of the sound channel, the phase locked loop develops a lock signal at the control voltage input 26 of voltage controlled oscillator 27, which locks the loop to the selected signal. The lock signal tracks the frequency of the selected signal: the lock signal (or alternatively, the signal at the first summing input of the summing means 25 which differs from the lock signal only by a DC shift) represents the FM demodulated signal.

In the calibrating state, the switch 17 connects signal source 16 to the band-pass filter 12. There is an overlap between the passband of the band-pass filter 12 and the spectrum of the signal source 16. Therefore, the signal source 16 will generate (via the band-pass filter 12) a signal with a spectrum in the passband of the band-pass filter 12 at the signal input 21a. In response to this signal, the phase locked loop will draw the frequency of the oscillator 27 towards the passband. Provided that at least part of the overlap between the spectrum and the passband of the band-pass filter 12 is within the capture range of the phase locked loop, the loop will draw the frequency into the passband. The book "Phaselock Techniques" by F. M. Gardner (cited above) describes in section 5.3 and particular pages 72 to 79 how the capture range, delimited by what this book calls the "pull in limited" for a phase locked loop is determined.

Depending on the parameters of the loop and the width of the passband, the oscillator 27 may track the signal at the signal input 21a or, without fully tracking the signal will at least be within the passband. The time average of the lock signal corresponds to the avenge passband frequency (as defined by an average of frequencies weighted by the signal passing strength as a function of frequency).

At the end of calibration, the control means 15 signal the memory 31 to store the lock signal. Subsequently, this lock signal will be supplied via the summing means 25 as a tuning signal to the voltage controlled oscillator 27, and will tune it within the passband. This means that the low-pass filter 23 needs to provide only a small DC component for tuning the voltage controlled oscillator 27 in the operating state. As a consequence, the phase locked provided by the loop is capable of handling weak input signals and is more robust against interfering signals.

During calibration, instead of storing the lock signal occuring at an arbitrary instant, one may also store the time averaged lock signal in the memory 31. This has the advantage that the voltage controlled oscillator 27 will be tuned to the avenge passband frequency. Storage of the time average may be provided for by the insertion of an averaging filter in front of the memory 31.

When the passband of the band-pass filter 12 is not within the capture range of the phase locked loop, the frequency of the oscillator 27 will not be drawn into the passband. However, this frequency will be drawn towards the passband. The frequency of the oscillator 27 can be brought within the passband by repeating the calibration procedure. In each repetition, the loop is allowed to develop a lock signal by adding to the tuning signal in the memory 31. The lock signal developed is then stored in the memory 31. In successive repetitions, this will bring the oscillation frequency increasingly closer to the passband of the band-pass filter 12. Eventually, the passband will come within capture range of the loop, and after that the frequency of the oscillator 27 will come within the passband. A maximum required number of repetitions may be determined from the parameters of the loop and the spread therein.

The analog-to-digital converter 30 and the digital-to-analog converter 32 need not in all cases have very high resolution. Any quantization errors mean that a larger compensation voltage needs to be provided by the loop, but if this compensation voltage is not too large, this may be acceptable.

Figure 5:
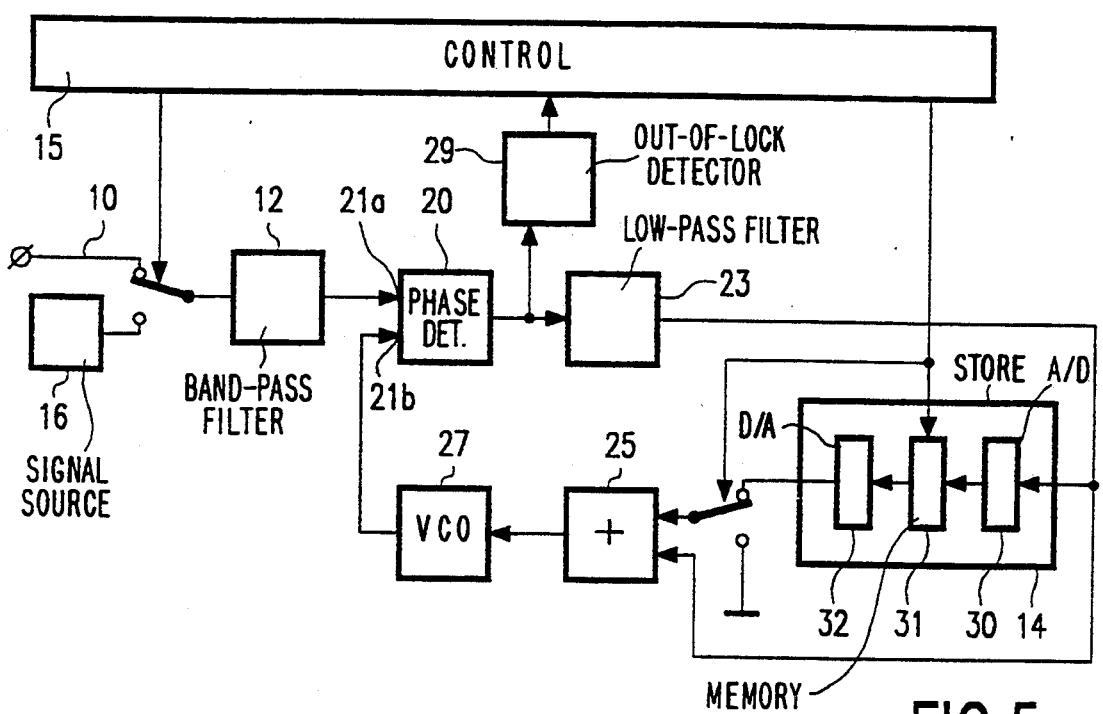
FIG. 5 shows a further device embodying the invention in a phase locked loop.

As depicted in FIG. 4, the storage means 14 are supplied with the lock signal. This is not necessary. Alternatively, as shown in FIG. 5, the signal formed by the low-pass filter 23, may be supplied to the analog-to-digital converter 30. In this case, a switch 28 must be provided between the memory 31 and the summing means 25. In the operating state, the switch 28 will be in a position to supply the stored signal from the memory 31 to the summing means. In the calibrating state, the switch 28 is set to supply a zero reference to the summing means 25.

Ordinarily the zero reference will be zero volts. But this is not the case if the analog-to-digital converter 30 and/or the digital-to-analog 32 converter produce an offset. Suppose a zero voltage were supplied at the analog-to-digital converter 20 input, and its digital version stored in the memory 31. In the case of offset, the output of the digital-to-analog converter 32 will output a non zero voltage in response to such a stored voltage. This non-zero voltage is the zero reference to be used in case of offset.

According to the invention, the phase locked loop serves a double purpose: in the operating state, it is used as an FM demodulator, in the calibrating state, it is used to find the tuning signal. In principle, one may use an identical loop for both purposes. However, the performance criteria for both purposes are different. Hence, it may be desirable to alter the parameters of the phase locked loop dependent on whether the device is in the operating state or in the callibrating state. In this way, the phase locked loop may be optimized for both purposes independently.

For example, as an optional feature, in the device depicted in FIG. 4, the control means 15 are also connected for controlling the low-pass filter 23. The purpose is to switch the low-pass filter 23 to a narrow bandwidth or to a wider bandwidth, in the operating state, and the calibrating state respectively. This bandwidth switch may be arranged for example, by providing two low-pass filters of different bandwidths and selecting the output of one of them for providing the lock signal.

The switchable bandwidth makes it possible to optimize the phase locked loop independently for the operating state and the calibrating state. With a narrower bandwidth in the operating state, the phase lock can be made more robust against interference. A narrower bandwidth may also be desirable if the band-pass filter 12 has a passband which is wider than necessary for passing only a frequency modulated signal. A wider bandwidth in the calibrating state provides for reliable capture of the lock over a wider range of frequency differences between the oscillating frequency of the voltage controlled oscillator 27 and the passband of the band-pass filter 12. This wider range may also be provided in other ways, for example, by changing the gain of the amplifier optionally included with the low-pass filter 23. General considerations on this and other points in the design of phase locked loops may be found in the book "Phaselock Techniques" by F. M. Gardner (cited above).

Another optional feature shown in FIG. 4 is the out of lock detector 29. This detector 29 serves to signal an out of lock condition to the control means 15. Upon out-of-lock detection, the control means 15 will enter the calibrating state. In this way the device provides for calibration if drift, for example due to temperature effects, affects the tuning in the operating state of the device D. The out-of-lock detector 29 may for example, be implemented as a trigger circuit which triggers when the output of the phase detector 20 is (too long) outside a predetermined range.

From the above, it will be clear that a broadband signal source 16, such as a noise source, may be advantageously used for calibrating a signal receiving device R, D according to the invention. It will be understood that embodiments given above serve to illustrate the principles of the invention. The particular implementation described are not intended as limitative. For example, although a digital memory 31 was described as storing means 14, such storing means may of course also be implemented as a voltage-hold capacitor, provided the voltage on it is refreshed sufficiently often. Similarly, instead of a phase locked loop, one may also use a frequency locked loop for the purpose of calibrating the oscillator 27, or for the purpose of frequency demodulation, or both. For a frequency locked loop, the phase detector 20 is replaced by a frequency difference discriminator.

Because the device according to the invention does not require any high accuracy components (except possibly the band-pass filter) the device lends itself particularly well to implementation in a semiconductive integrated circuit.

We claim:

1. A signal receiving device comprising control means for switching the signal receiving device between an operating state and a calibrating state, the signal receiving device comprising:

a tunable circuit being tunable in frequency to a signal received by the signal receiving device thereby allowing the signal to pass through the tunable circuit, the tunable circuit being arranged between a main signal input and a main signal output of the signal receiving device and having a tuning input;

a calibrating signal source for supplying a calibrating signal;

means for selectably coupling the calibrating signal source to the main signal input during the calibrating state;

tuning signal selecting and storing means coupled to the main signal output for selecting a tuning signal which, during the calibrating state, when applied to the tuning input of the tunable circuit, tunes the tunable circuit to a spectral component of the calibrating signal, said tuning signal selecting and storing means includes memory means for storing said tuning signal selected during said calibrating state, said tuning signal selecting and storing means applying said stored tuning signal to the tuning input of said tunable circuit during the operating state, characterized in that said calibrating signal source is a broadband signal source, the calibrating signal containing a plurality of spectral components, said tunable circuit being tunable to at least one of said plurality of spectral components, and said signal receiving device further comprising:

a band-pass filter in series with the tunable circuit between the main signal input and the main signal output, said at least one of said plurality of spectral components being passed by the band-pass filter.

2. A signal receiving device according to claim 1, characterized, in that the calibrating signal source is a broadband noise source.

3. A signal receiving device according to claim 1 characterize, in that the band-pass filter is provided between the main signal input and the tunable circuit, the band-pass filter having a passband which has a first overlap with a tuning range of the tunable circuit, a spectral range covered by the spectral components having at least a second overlap with the first overlap.

4. A signal receiving device according to claim 3, wherein the tunable circuit includes a phase locked loop, the main signal input being coupled to a first input of a phase detector, which has an output for a lock signal coupled to a frequency control input of an oscillator which has an output coupled to a second input of the phase detector, the tuning input being coupled to biassing means for biasing the lock signal with the tuning signal, the tuning signal selecting and storing means being arranged for storing the lock signal as the tuning signal.

5. A signal receiving device according to claim 4, characterized, in that the phase lock loop comprises loop capture range setting means, the control means being arranged to control the setting means to set the capture range to a first range in the operating state and to a second range, wider than the first range and comprising said second overlap, in the calibrating state.

6. A signal receiving device according to claim 4, characterized, in that it comprises out of lock detection means, for detecting whether the phase locked loop is out-of-lock in the operating state, and for thereupon signalling the control means to switch the device into the calibrating state.

7. A signal receiving device according to claim 4, characterized, in that the tunable circuit is an FM receiver/demodulator, a phase detection output of the phase locked loop feeding a demodulated FM signal output.

8. A signal receiving device according to claim 1, characterized, in that the tunable circuit is a tunable band-pass filter, provided between the signal input and the band-pass filter.

9. A signal receiving device according to claim 8, characterized, in that the tunable band-pass filter is coupled to the band-pass filter via a retunable frequency converter, the control means being arranged for switching the device into the calibrating state upon retuning of the frequency converter, for calibrating the tunable circuit to the retuned frequency converter.

10. A method for calibrating a tunable circuit for operation under control of a stored tuning signal, the method comprising:

supplying a reference signal to the signal input;
subsequently measuring the tuning signal which tunes the tunable circuit to said reference signal, and storing that timing signal, characterized, in that the reference signal is generated by band-pass filtering a broadband signal, the broadband signal having a spectrum which has a common overlap with both a tuning range of the tunable circuit and a passband of the band-pass filtering operation.

* * * * *